US008908736B2

(12) United States Patent
Park et al.

(10) Patent No.: US 8,908,736 B2
(45) Date of Patent: Dec. 9, 2014

(54) NANOLASER GENERATOR USING GRAPHENE ELECTRODE AND METHOD FOR MANUFACTURING THE SAME

(71) Applicant: Korea University Research and Business Foundation, Seoul (KR)

(72) Inventors: Hong-Gyu Park, Seoul (KR); Yoon-Ho Kim, Gyeonggi-do (KR); Minsoo Hwang, Seoul (KR); Soon-Hong Kwon, Gyeonggi-do (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 14/045,413

(22) Filed: Oct. 3, 2013

(65) Prior Publication Data

US 2014/0233599 A1    Aug. 21, 2014

(30) Foreign Application Priority Data

Feb. 21, 2013    (KR) .................. 10-2013-0018747

(51) Int. Cl.
*H01S 3/08*     (2006.01)
*H01L 33/38*    (2010.01)
*H01S 3/038*    (2006.01)
*H01L 33/40*    (2010.01)

(52) U.S. Cl.
CPC ............... *H01S 3/038* (2013.01); *H01L 33/38* (2013.01); *H01L 33/40* (2013.01)
USPC ......................................................... 372/92

(58) Field of Classification Search
CPC ..... H01S 3/042; H01S 5/0425; H01S 5/0427; H01S 5/0428; H01S 5/1003; H01S 5/1075; H01S 5/1071
See application file for complete search history.

(56) References Cited

U.S. PATENT DOCUMENTS

2012/0153260 A1*  6/2012  Kim et al. ................. 257/14
2012/0308468 A1* 12/2012  Choi et al. ............ 423/415.1
2012/0328906 A1  12/2012  Kwon et al.

FOREIGN PATENT DOCUMENTS

KR           101146560         5/2012
KR       10 2012 0133873 A    12/2012
WO        WO 2009/136913 A1   11/2009

OTHER PUBLICATIONS

K. Nozaki, S. Kita, T. Baba, "Room temperature continuous wave operation and controlled spontaneous emission in ultrasmall photonic crystal nanolaser." Optical Society of America, vol. 15, No. 12, p. 7506-7514 (Jun. 11, 2007).

* cited by examiner

*Primary Examiner* — Tuan Nguyen
(74) *Attorney, Agent, or Firm* — Alston & Bird LLP

(57) ABSTRACT

The present disclosure relates to a nanolaser generator using a transparent graphene electrode, a method for manufacturing the same, and a single nanopillar LED using the same. The nanolaser generator includes a microdisk resonator, a protruding dielectric ring provided to surround a boundary surface of the microdisk resonator, an external dielectric ring provided at an outer side of the microdisk resonator, and a transparent graphene electrode provided at upper surfaces of the microdisk resonator, the protruding dielectric ring and the external dielectric ring. Therefore, the processes required for generating a nanolaser may be reduced by half in comparison to a general technique, and a nanolaser may be generated just with a micro current.

15 Claims, 10 Drawing Sheets

(Before current injection)   (After current injection)

(EL spectrum)

(a)

(b)

NANOLASER GENERATOR USING GRAPHENE ELECTRODE AND METHOD FOR MANUFACTURING THE SAME

CROSS-REFERENCE TO RELATED APPLICATIONS

This application claims priority under 35 U.S.C. §119 to Korean Patent Application No. 10-2013-0018747 filed on Feb. 21, 2013, in the Korean Intellectual Property Office, the disclosure of which is incorporated herein by reference in its entirety.

TECHNICAL FIELD

The present disclosure relates to a nanolaser generator using a transparent graphene electrode, a method for manufacturing the same, and a single nanopillar LED using the same.

BACKGROUND

Nanolasers based on a semiconductor have rotationally evolved from a vertical cavity surface emitting laser of one-dimensional photonic crystal representing a first generation nanolaser, via a two-dimensional photonic crystal laser of a second generation, to a nano-ladder laser of a third generation, which looks like a one-dimensional nanolaser.

In detail, in 1989, Bell Laboratories in U.S. has successfully made a vertical cavity surface emitting laser (VCSEL), which is a novel semiconductor laser, namely a first generation nanolaser, through experiments. The VCSEL having lengths of several microns in three directions is widely used in the industries as a short-distance optic interconnecting element in these days, and also accepted as a representative semiconductor microstructure of a resonator quantum dynamics. For this reason, the VCSEL is being actively studied in the present.

In addition, in 1999, the research team of Pref. Scherer in California Institute of Technology has observed laser oscillation from an InP thin-film two-dimensional photonic crystal resonator, which is a compound semiconductor, for the first time and made a two generation nanolaser. This may relatively easily realize great Q/V (a value obtained by dividing a quality factor by a mode volume V) by using a semiconductor-based photonic crystal resonator.

In addition, in 2008 and 2009, a nano-ladder resonator having a smaller volume in a resonance mode and a very large Q value has been proposed and implemented, thereby making a three generation nanolaser.

Among them, the VCSEL is industrially widely used for light source for short-distance optical communication, laser mouse for PC, or the like.

In order to make the two-dimensional photonic crystal resonator as an 'available' single photon generator which may be applied to quantum information communications, many problems should be solved in the future. In other words, it is difficult to position an optimum quantum dot at an optimum place.

The works for efficiently collecting light emitted from a very small laser and sending the light to an optical fiber or an optical detector are very important and should be studied thoroughly.

RELATED LITERATURES

Patent Literature

Korean Patent Registration No. 1146560

Non-Patent Literature

Optics express Vol. 15, No. 12, pp. 7506~7514

SUMMARY

The present disclosure is directed to providing a nanolaser generator using a graphene electrode, which may generate a nanolaser with a micro current while reducing the processes of the nanolaser generator, which is driven by electricity to generate a nanolaser, by half.

The present disclosure is also directed to providing a method for manufacturing the nanolaser generator.

The present disclosure is also directed to providing a single nanopillar LED using the graphene electrode.

In one aspect, there is provided a nanolaser generator using a graphene electrode, which may include: a microdisk resonator; a protruding dielectric ring provided to surround a boundary surface of the microdisk resonator; an external dielectric ring provided at an outer side of the microdisk resonator; and a transparent graphene electrode provided at upper surfaces of the microdisk resonator, the protruding dielectric ring and the external dielectric ring.

A metal layer may be further provided at a center portion of the microdisk resonator.

The metal layer may be at least one selected from the group consisting of gold, a gold/germanium alloy, a gold/zinc alloy and a nickel/gold/germanium alloy.

The graphene electrode may have five to ten layers, and the graphene electrode may have transmittance of 91.9% or above when electroluminescence is 1,550 nm.

The dielectric ring may be made of polymethylmethacrylate.

The microdisk resonator may include an InGaAsP quantum well of an n-i-p layer.

The nanolaser generator using a graphene electrode may generate a nanolaser when a micro current of 300 µA or below is applied to the transparent graphene electrode.

In another aspect, there is provided a method for manufacturing a nanolaser generator using a graphene electrode, which may include: forming a protruding dielectric ring at a boundary surface of an InGaAsP microdisk resonator made with a wafer composed of an InGaAsP layer, an InP sacrificial layer and an InP matrix layer by processing a dielectric material into a ring structure to surround the microdisk resonator; removing the InP sacrificial layer below the microdisk resonator while remaining an InP pole by means of wet etching; forming an external dielectric ring by processing a dielectric material into a ring structure again at an outer side of the microdisk resonator; and providing a transparent graphene electrode at upper surfaces of the microdisk resonator, the protruding dielectric ring and the external dielectric ring.

Between the forming of a protruding dielectric ring at the microdisk resonator and the removing of the InP sacrificial layer, the method may further include providing a metal layer to a center portion of the microdisk resonator.

The graphene electrode may have five to ten layers, and the graphene electrode may have transmittance of 91.9% or above when electroluminescence is 1,550 nm.

The dielectric material may be polymethylmethacrylate.

In another aspect, there is provided a single nanopillar LED using a graphene electrode, which may include: a nanopillar; an external dielectric ring provided at an outer side of the nanopillar; and a transparent graphene electrode provided at upper surfaces of the nanopillar and the external dielectric ring.

The graphene electrode may have transmittance of 91.9% or above when electroluminescence is 1,550 nm.

The dielectric ring may be made of polymethylmethacrylate.

In case of a general nanolaser generator using a metal, if the metal is positioned near a laser, the laser light is absorbed by a metal electrode or diffused, which disturbs the generation of laser light. Therefore, a general nanolaser is generated by means of optical pumping in which energy is injected using another laser instead of electric energy. The electric-driven general nanolaser needs a side p-i-n joint which is well aligned with nanocavity or needs to dispose an electrode of a sub-micron size at a suitable position with the accuracy of a sub-wavelength scale, which are however complicated techniques.

However, the nanolaser generator of the present disclosure allows easy passage of electricity and good penetration of light. Therefore, even though a graphene electrode is positioned adjacent thereto, the light is substantially not absorbed or diffused. In addition, a nanolaser may be generated by injecting electricity using the graphene electrode which is as soft as a toilet tissue and thus easily transformable.

In addition, the nanolaser generator of the present disclosure may reduce the processes required for generating a nanolaser by half in comparison to a general electric-driven nanolaser generator and generate a nanolaser just with a micro current. Therefore, it is possible to commercialize and massproduce an electric-driven nanolaser. Moreover, if a nanolaser emitted from the nanolaser generator is used, an optical element (a device for controlling movement of light, a laser or an LED) may be easily moved with electricity, which may advance the development of an optical computer.

BRIEF DESCRIPTION OF THE DRAWINGS

The above and other objects, features and advantages of the present disclosure will become apparent from the following description of certain exemplary embodiments given in conjunction with the accompanying drawings, in which.

DETAILED DESCRIPTION OF EMBODIMENTS

The present disclosure is directed to providing a nanolaser generator using a graphene electrode, which may generate a nanolaser with a micro current while reducing the processes of the nanolaser generator, which is driven by electricity to generate a nanolaser, by half; a method for manufacturing the same; and a single nanopillar LED using the same.

Hereinafter, the present disclosure will be described in detail.

Figure 1:
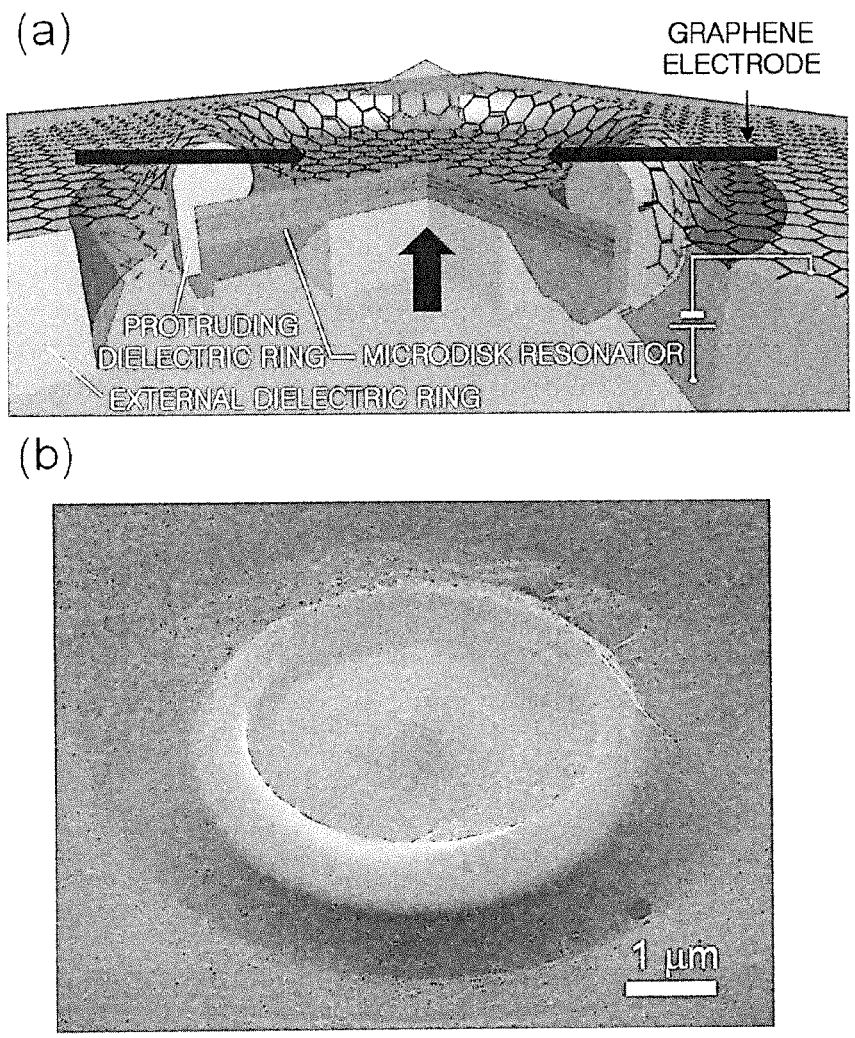
FIG. 1a is a cross-sectional view showing a nanolaser generator manufactured according to an embodiment of the present disclosure.
FIG. 1b is an SEM photograph showing the nanolaser generator manufactured according to an embodiment of the present disclosure.

FIG. 1a is a cross-sectional view showing a nanolaser generator manufactured according to an embodiment of the present disclosure, and FIG. 1b is an SEM photograph showing the nanolaser generator manufactured according to an embodiment of the present disclosure.

As shown in FIGS. 1a and 1b, the nanolaser generator using a graphene electrode according to the present disclosure includes a microdisk resonator, a protruding dielectric ring, an external dielectric ring and a transparent graphene electrode. At this time, the dielectric ring is made of a dielectric material and may be classified into a protruding dielectric ring provided to surround a boundary surface of the microdisk resonator and protruding from the microdisk resonator, and an external dielectric ring provided spaced apart from the microdisk resonator by a predetermined distance to surround the microdisk resonator. In addition, the graphene electrode is provided to cover upper surfaces of the microdisk resonator, the protruding dielectric ring and the external dielectric ring.

The protruding dielectric ring and the external dielectric ring have a circular ring shape if the microdisk resonator has a circular shape, without being limited thereto.

If electricity is applied to the graphene electrode, the nanolaser generator of the present disclosure generates a nanolaser while light turns round and round inside the circular microdisk resonator (a structure required for operating a laser) without departing therefrom.

The generated nanolaser gives a coherent light source and may be efficiently coupled with another nano-photon device such as a waveguide and a probe for use in an ultra-compact integrated optics. In order to utilize the nanolaser to the maximum, electricity may be injected.

The microdisk resonator employed in the present disclosure is manufactured by means of a semiconductor processing method using a (an n-i-p InGaAsP slab with a thickness of 260 nm)/(a p-InP sacrificial layer with a thickness of 1 μm)/(a p-InP substrate) wafer structure. Three layers of the InGaAsP quantum well are included in the slab, and the n-i-p InGaAsP slab is used as a microdisk resonator.

Since the graphene employed in the present disclosure has very high carrier mobility and high optical transmittance over a wide spectrum range of visible and infrared rays, the graphene may be used as a transparent electrode.

The graphene electrode made of graphene is visually thin, is coupled to a cavity designed to minimize optical attenuation therein, and provides a strong current path. In addition, the graphene electrode plays a role of an efficient carrier diffusion layer as well as an important role as an electrode for n-type contact (FIG. 1a).

The graphene electrode is well deposited to cover upper surfaces of the microdisk resonator having an InGaAsP quantum well of a n-i-p layer, the protruding dielectric ring and the external dielectric ring along profiles thereof, or may freely stay in the air between the external dielectric ring and the microdisk resonator (FIG. 1b). This is impossible in a general metal electrode.

In addition, the graphene electrode may be used as an alternative of a transparent oxide conductor or metal, which is easy to break and expensive, due to its excellent mechanical strength and elasticity, and may also be mounted to a complicated surface of a non-planar three-dimensional nanostructure having a height difference of 400 to 600 nm from the protruding dielectric ring to the microdisk resonator (FIG. 1b).

For easy emission of nanolaser, the graphene electrode may have five to ten layers. In this case, light may easily penetrate through the graphene electrode due to small thickness. Therefore, even though the graphene electrode is positioned near the laser, light is substantially not absorbed or scattered, thereby giving no serious influence on the laser characteristics.

The external dielectric ring employed in the present disclosure separates an electrically conductive graphene electrode from the p-doped InP substrate, and the protruding dielectric ring optically separates the graphene electrode at a boundary of the microdisk resonator where a whispering-gallery mode (WGM) is greatly restricted. The graphene electrode causes optical absorption, and the protruding dielectric ring separates the graphene electrode from the boundary of the microdisk resonator where the WGM is formed, so that the WGM may maintain a high quality Q.

At a lower surface of the microdisk resonator, the p-doped InP pole formed by removing the InP sacrificial layer serves as a p-type electrode.

Electros and holes are injected through the graphene electrode and the InP pole, respectively provided at the upper surface and the lower surface of the n-i-p microdisk, and electroluminescence (EL) having a maximum wavelength of 1,550 nm or below is emitted at the microdisk resonator.

In addition, the present disclosure provides a nanolaser generator using a graphene electrode, which further includes a gold layer provided at a center portion of the microdisk resonator.

Between the InGaAsP material of the microdisk resonator and the graphene electrode, a high contact resistance is generated, which may be reduced by introducing a metal layer to the center portion of the microdisk resonator. The metal may be at least one selected from the group consisting of gold, gold/germanium alloy, gold/zinc alloy and nickel/gold/germanium alloy, among which gold is most preferred in order to reduce a contact resistance more excellently.

Figure 2:
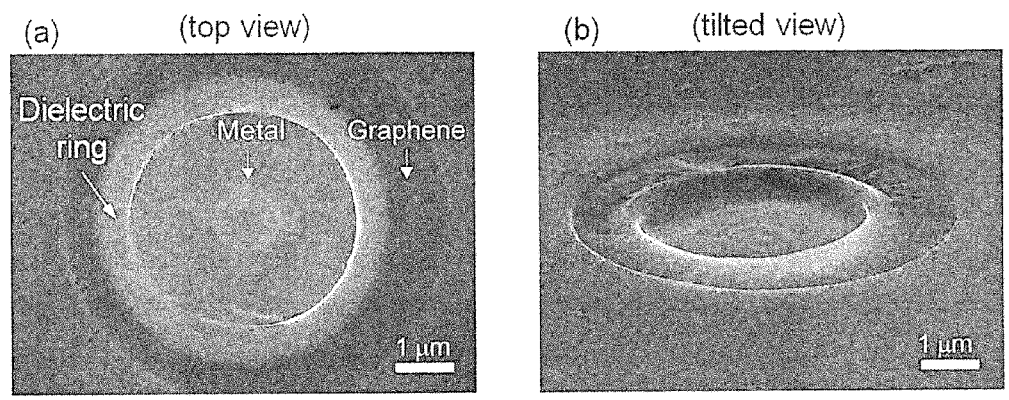
FIG. 2a is an SEM photograph showing a nanolaser generator using a graphene electrode additionally having a gold layer according to another embodiment of the present disclosure, which is observed from the above.
FIG. 2b is an SEM photograph showing the nanolaser generator using a graphene electrode additionally having a gold layer according to another embodiment of the present disclosure, which is taken in a tilted state.

FIG. 2a is an SEM photograph showing a nanolaser generator using a graphene electrode additionally having a gold layer according to another embodiment of the present disclosure, which is observed from the above, and FIG. 2b is an SEM photograph showing the nanolaser generator using a graphene electrode additionally having a gold layer according to another embodiment of the present disclosure, which is taken in a tilted state.

As shown in FIGS. 2a and 2b, the metal layer is provided at the center portion of the microdisk resonator having a protruding dielectric ring at the boundary surface, and the graphene electrode is deposited to the upper surface thereof.

In addition, the present disclosure provides a method for manufacturing a nanolaser generator using a graphene electrode.

Figure 3:
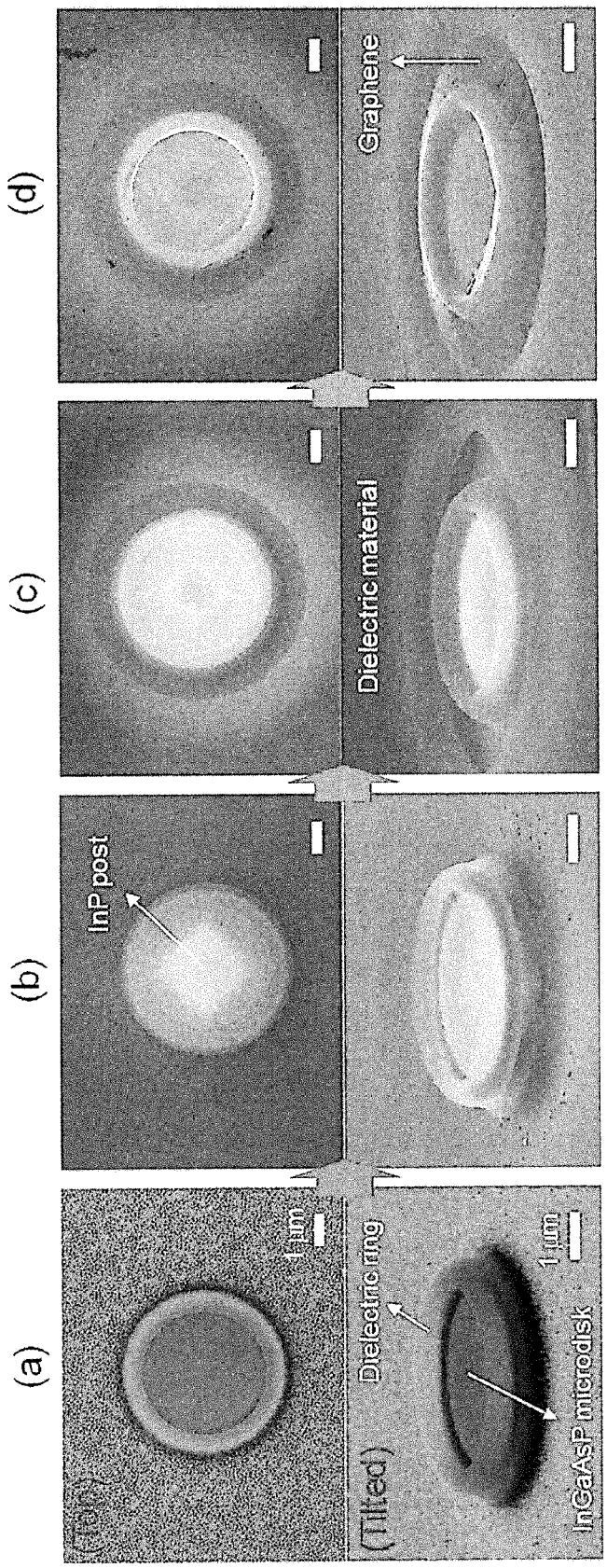
FIG. 3 is an SEM photograph for illustrating a method for manufacturing a nanolaser generator using a graphene electrode according to an embodiment of the present disclosure.
Figure 4:
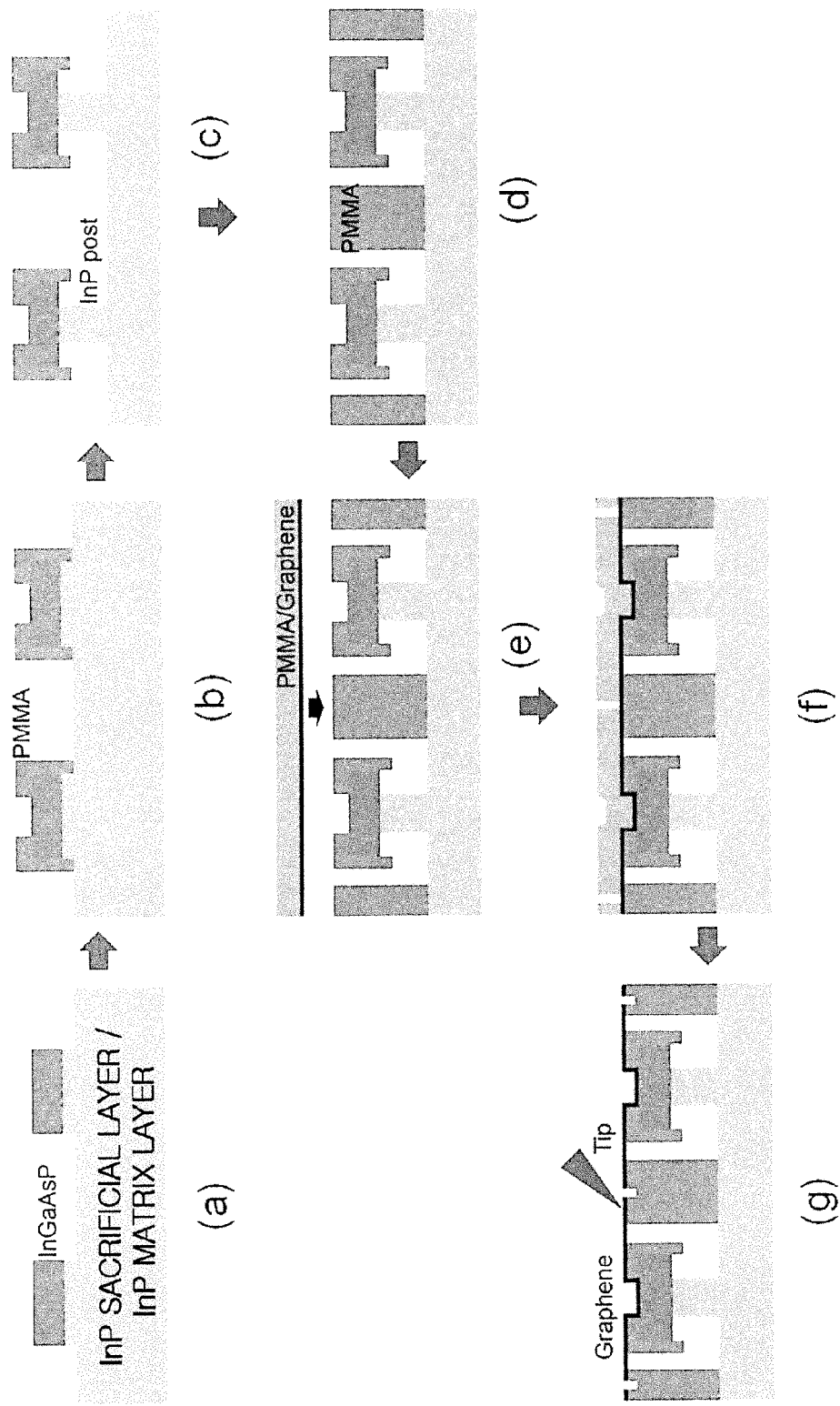
FIG. 4 is a diagram for illustrating the method for manufacturing a nanolaser generator using a graphene electrode according to an embodiment of the present disclosure.

FIG. 3 is an SEM photograph for illustrating a method for manufacturing a nanolaser generator using a graphene electrode according to an embodiment of the present disclosure, and FIG. 4 is a diagram for illustrating the method for manufacturing a nanolaser generator using a graphene electrode according to an embodiment of the present disclosure.

The nanolaser generator of the present disclosure is manufactured by (a) forming a protruding dielectric ring at a boundary surface of an InGaAsP microdisk resonator made with a wafer composed of an InGaAsP layer, an InP sacrificial layer and an InP matrix layer by processing a dielectric material into a ring structure to surround the microdisk resonator, (b) removing the InP sacrificial layer below the microdisk resonator while remaining an InP pole by means of wet etching, (c) forming an external dielectric ring by processing a dielectric material into a ring structure again at an outer side of the microdisk resonator, and (d) providing a transparent graphene electrode at an upper surface of the microdisk resonator, the protruding dielectric ring and the external dielectric ring.

First, in Step (a), a dielectric material is processed into a ring structure to surround (except for the lower surface of the microdisk resonator) the boundary surface of the InGaAsP microdisk resonator made with a wafer (FIG. 4a) composed of an InGaAsP layer, an InP sacrificial layer and an InP matrix layer, thereby forming a protruding dielectric ring to protrude over the upper surface of the microdisk resonator (FIGS. 3a and 4b).

The InGaAsP microdisk resonator has a diameter of 5 μm or below, preferably 3 to 5 μm, and is made by means of electron-beam lithography and dry wetting.

The dielectric material may be cross-linked polymethylmethacrylate (cross-linked PMMA), without being limited thereto.

After Step (a), providing a metal layer to a center portion of the microdisk resonator may be further added.

Next, in Step (b), in order to form a current path, the InP sacrificial layer is removed from the wafer structure by means of wet etching, thereby forming an InP pole at the lower surface of the microdisk resonator (FIGS. 3b and 4c).

Next, in Step (c), a dielectric material is processed again at an outer side slightly spaced apart from the microdisk resonator, thereby forming the external dielectric ring to surround the microdisk resonator (FIGS. 3c and 4d).

Next, in Step (d), a transparent graphene electrode is deposited to upper surfaces of the microdisk resonator, the protruding dielectric ring and the external dielectric ring. In order to individually operate nanolaser generators manufactured by mass production, the graphene electrodes are divided by means of electron-beam lithography and $O_2$ plasma. The graphene electrode to be deposited is coated with a dielectric material which is used for protecting the graphene electrode during the separating process. After the separating process, impurities are removed using acetone (FIG. 4f), and a current is supplied to a pure graphene electrode by using a metal tip (FIG. 4g).

Figure 5:
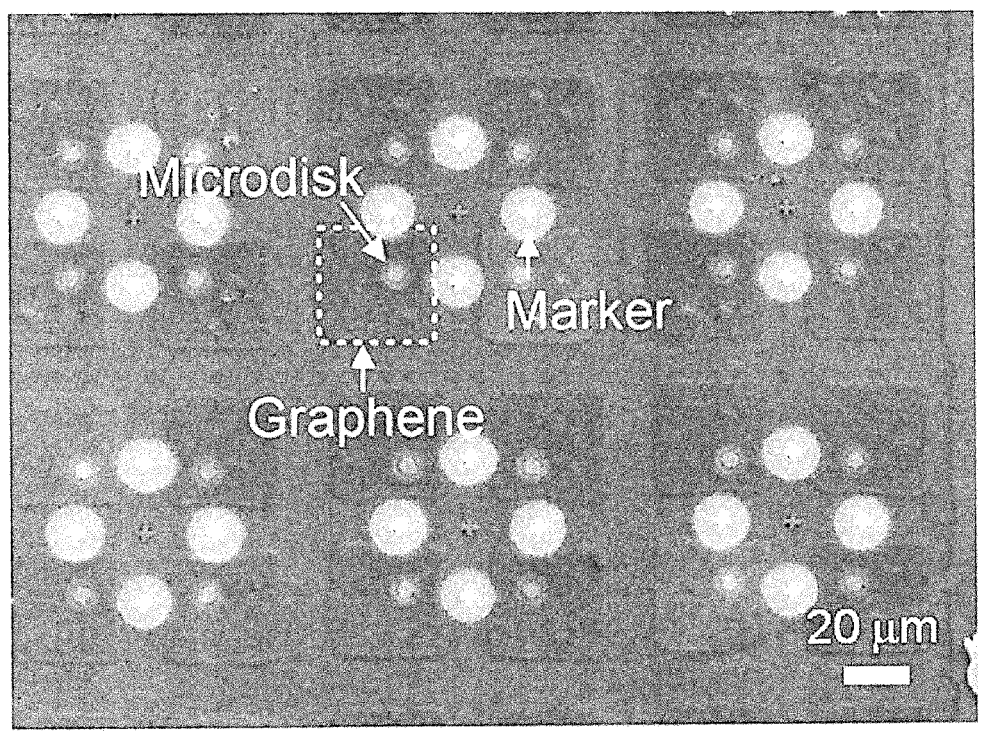
FIG. 5 is an SEM photograph which reproduces a nanolaser generator using a graphene electrode in a large area according to an embodiment of the present disclosure.

As described above, the nanolaser generator may be manufactured in a simple and easy way, while ensuring high yield and allowing mass production of nanolaser generators (FIG. 5).

In addition, if the nanolaser generator manufactured as above is used, a nanolaser may be generated even when a micro current, for example a current of 300 μA or below, is applied at a room temperature (22 to 28° C.), which is in a level substantially similar to a current amount in a general method requiring complicated and particular additional processes but reduces the processes by half.

In addition, the graphene electrode employed in the present disclosure may be manufactured as follows.

A graphene electrode having multiple layers is composed using a home-built chemical vapor deposition system having a horizontal tube smelting furnace.

First, a Ni film having a thickness of 200 nm is deposited on a $SiO_2$/Si substrate having a thickness of 200 nm by using a thermal evaporator, and the Ni/$SiO_2$/Si substrate is transferred to a quartz tube reactor. The quartz tube reactor is vacated using a pressure of 100 mTorr or below and then filled again with $H_2$/Ar mixture gas (25% $H_2$ in Ar) till reaching an atmospheric pressure.

Next, the Ni/$SiO_2$/Si substrate is thermally treated at 1,000° C. for 30 minutes under a $H_2$/Ar mixture gas having a flow rate of 60 sccm where a methane gas (10 sccm) flow is set.

Next, the thermally treated substrate is left alone for 1 minute and then the supply of methane gas is terminated. At this time, the quartz tube reactor is rapidly cooled to a room temperature at a cooling rate of 10° $Cs^{-1}$ or below under a successive $H_2$ and Ar circumstance. During the cooling process, carbon atoms melted in the nickel are extracted upon the surface of nickel to form multiple graphene layers.

Next, the multiple composed graphene electrode layers are coated with a thin protective layer of PMMA, and then the PMMA/graphene electrode is dipped in a HF solution to etch the Ni and $SiO_2$ layers, thereby separating a PMMA/graphene electrode from the substrate.

Next, a remaining Ni layer below the PMMA/graphene electrode is removed by TFG which is a Ni etching solution, and then the electrode is washed with water.

After that, the hydrophobic PMMA/graphene electrode may be moved to various kinds of substrates such as transmission electron microscopy (TEM) grid or glass in terms of optical characteristics and may float on water.

Measurement of Characteristics of the Graphene Electrode

Figure 6:
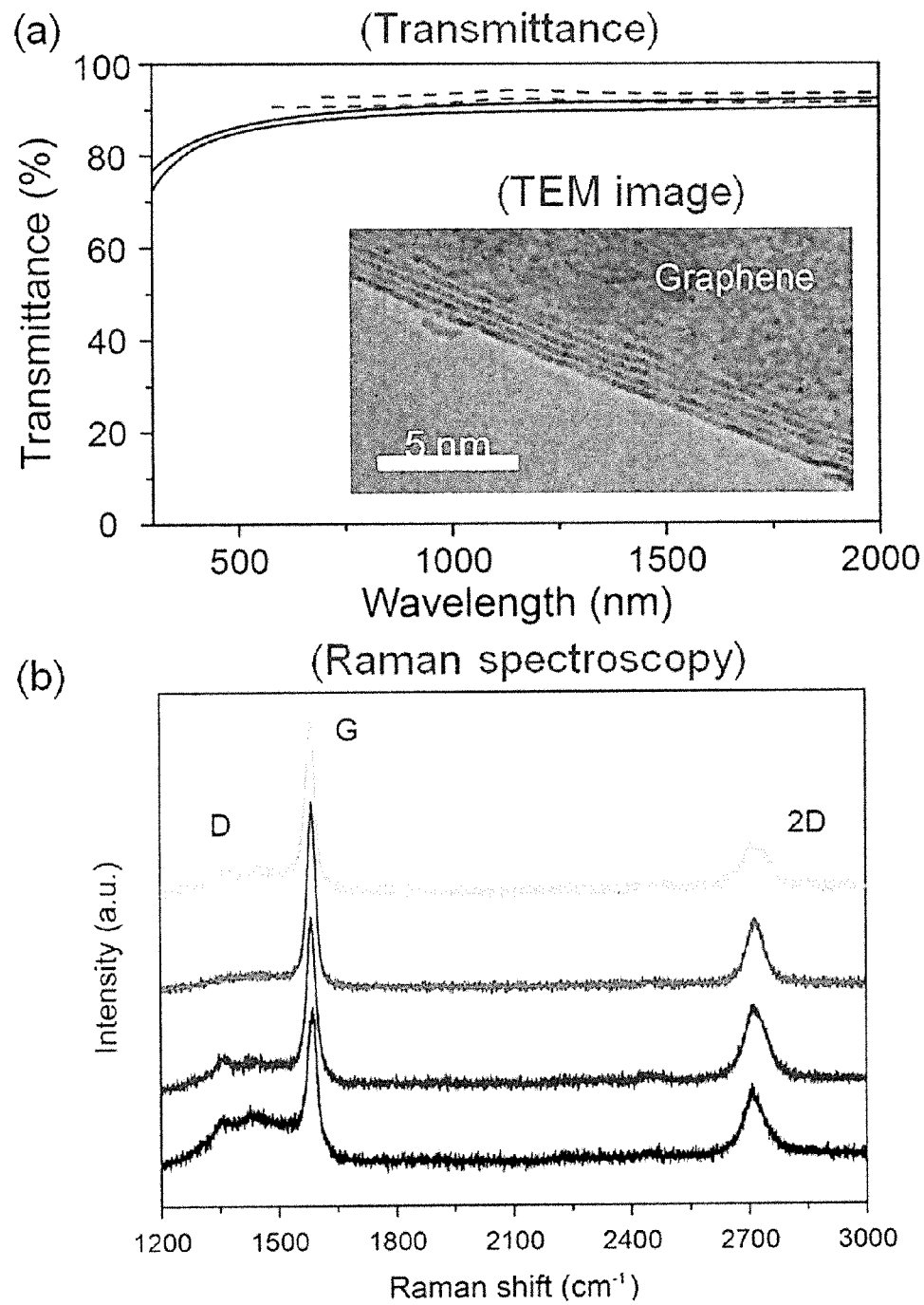
FIG. 6a is a graph showing a transmittance of the graphene electrode employed in the present disclosure.
FIG. 6b is a graph, measured by Raman spectroscopy, of the graphene electrode employed in the present disclosure.

FIG. 6a is a graph showing a transmittance of the graphene electrode employed in the present disclosure, and FIG. 6b is a graph, measured by Raman spectroscopy, to identify the number of layers of the graphene electrode employed in the present disclosure.

As shown in FIG. 6a, in regard to the graphene electrode (5 to 10 layers) employed in the present disclosure, high transmittance of 91.9% or above was measured when electroluminescence has a maximum wavelength of 1,550 nm or below. Therefore, the graphene electrode may be used as a transparent electrode in a wavelength range of near-IR and middle-IR.

In order to quantitatively analyze optical attenuation at a microdisk cavity which contacts the graphene electrode, optical characteristics of the cavity mode and transmittance of the graphene electrode were calculated using 3D finite-difference time-domain (FDTD) simulation. This reveals whether the calculated transmittance of a graphene sheet (a black dotted line) having a thickness other than 1.5 and 2.0 nm (a red dotted line) corresponding to a graphene electrode having five to seven layers is well matched with an experiment result.

The number of layers of the graphene electrode was photographed using a TEM (the photograph of FIG. 6a), and the number of layers of the graphene electrode used in the photographing was five.

As shown in FIG. 6b, after the Raman spectroscopy measurement for the graphene electrode employed in the present disclosure, it may be understood that the graphene electrode has five to ten layers according to a ratio between the G peak and the 2D peak and their center Raman shift values.

Figure 7:
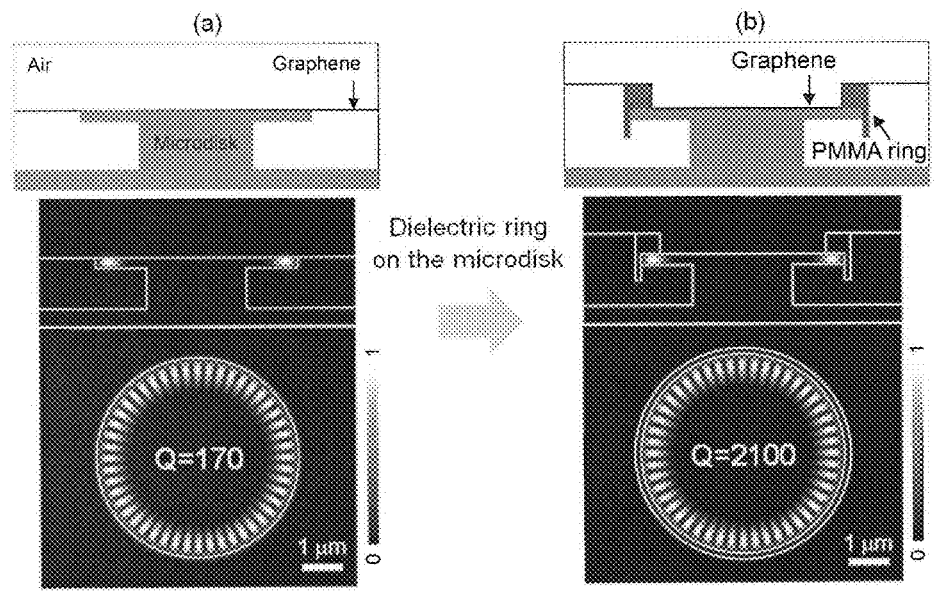
FIG. 7a shows a Q factor of a nanolaser generator having a graphene sheet deposited on the upper surface of a microdisk resonator without using a protruding dielectric ring.
FIG. 7b shows a Q factor of a nanolaser generator having a graphene sheet deposited on the upper surface of a microdisk resonator at which a protruding dielectric ring is formed according to an embodiment of the present disclosure.

FIG. 7a shows a Q factor of a nanolaser generator having a graphene sheet deposited on the upper surface of a microdisk resonator without using a protruding dielectric ring, and FIG. 7b shows a Q factor of a nanolaser generator having a graphene sheet deposited on the upper surface of a microdisk resonator at which a protruding dielectric ring is formed.

The FDTD simulation was performed using a graphene electrode having a thickness of 1.5 nm, and a Q factor and a mode profile of the top of the microdisk resonator are calculated.

The light generated from the microdisk resonator which contacts the graphene electrode form a whispering-gallery mode (WGM) which is strongly restricted at a boundary of the microdisk resonator.

In the protruding dielectric ring structure introduced to the boundary of the microdisk resonator where optical attenuation by the graphene electrode is minimized, a high Q factor of 2,100 or below was calculated (FIG. 7b). This value is 12 times higher than the Q factor of 170 (FIG. 7a) calculated without the protruding dielectric ring structure. Therefore, the cavity design including the protruding dielectric ring structure will be very useful for preventing undesired optical attenuation and describing nanolaser lasing at a lower limit point.

Measurement of Characteristics of the Nanolaser

Figure 8:
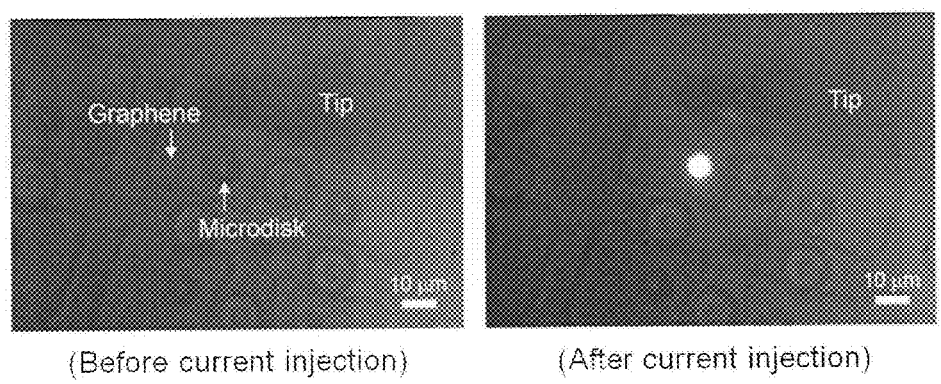
FIG. 8 is a photograph, taken by an IR camera, for illustrating that a current is injected to the nanolaser generator manufactured according to an embodiment of the present disclosure.

FIG. 8 is a photograph, taken by an IR camera, for illustrating that a current is injected to the nanolaser generator manufactured according to an embodiment of the present disclosure.

The processed microdisk cavity was electrically pumped using 100 ns current pulses during 1 μs (10% duty cycle) at a normal temperature. The current was injected using a metal tip which contacts the graphene electrode at the upper surface of the external dielectric ring.

By injecting the current, the light emitted from the microdisk resonator was photographed by an object lens of a ×20 or ×50 long-working-distance microscope which focuses on either a spectrometer or an IR camera.

Figure 9:
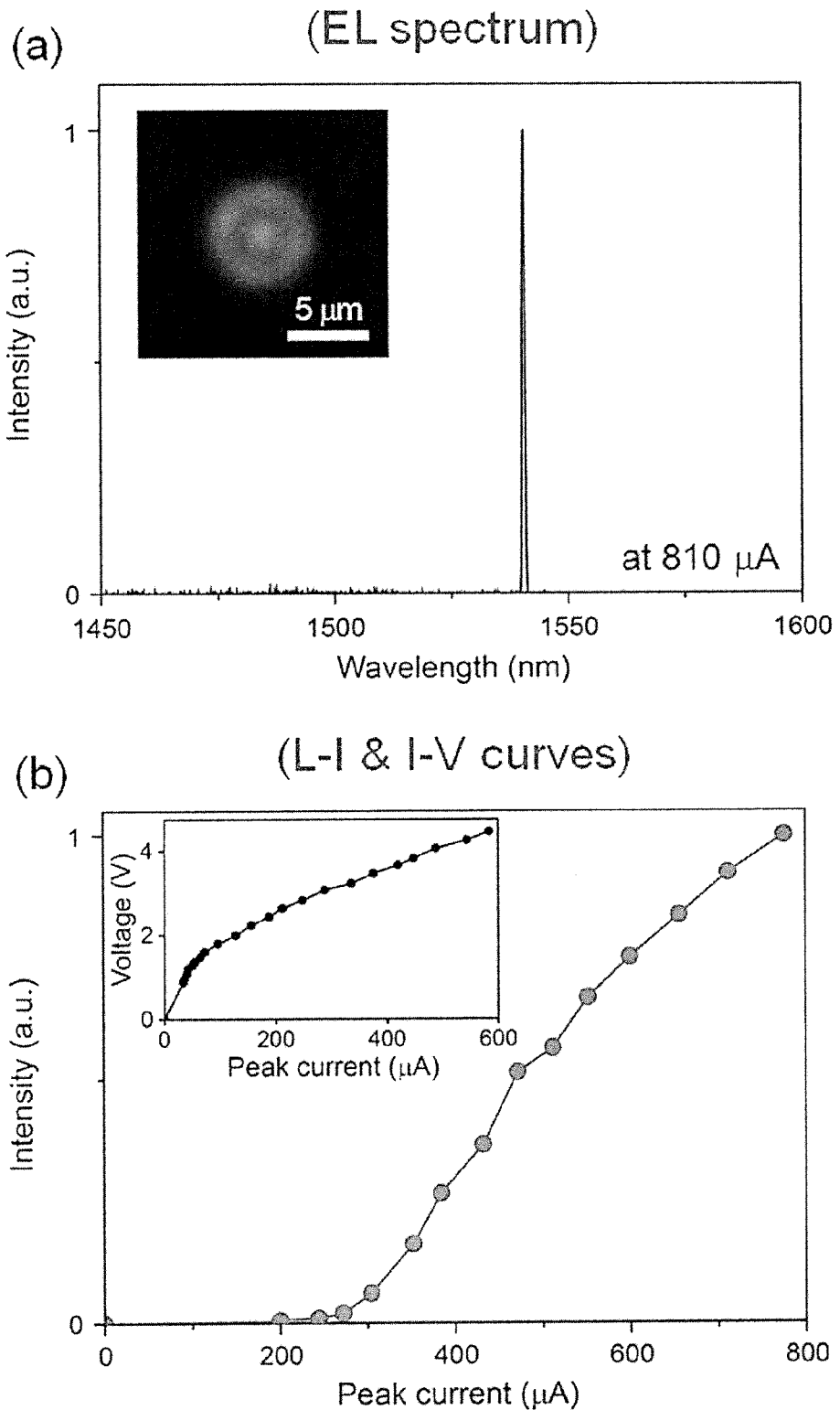
FIG. 9a is a graph showing a measured intensity (spectrum) according to the wavelength of a laser light generated by the nanolaser generator manufactured according to an embodiment of the present disclosure.
FIG. 9b is a graph showing an output intensity of a generated light according to the current injected into the nanolaser generator manufactured according to an embodiment of the present disclosure.

FIG. 9a is a graph showing a measured intensity (spectrum) according to the wavelength of a laser light generated by the nanolaser generator of the present disclosure, and FIG. 9b is a graph showing an output intensity of a generated light according to the current injected into the nanolaser generator of the present disclosure.

As shown in FIG. 9a, in an increased current, single-mode lasing was observed at a wavelength of 1,540.5 nm. In addition, a single-mode laser image obtained by the IR camera shows strong light emission at a boundary of the microdisk cavity (the photograph of FIG. 9a).

As shown in FIG. 9b, in order to measure shifting to a clear laser mode, output intensity of light was observed while changing the injected current. In the output intensity, super-linear increase was clearly observed at a low laser limit point of 300 μA or below. The limit current is comparable with that of a microdisk laser of a similar size, reported in the past.

As a result of the spectrum analysis, as the injected current increases, the line width of the generation mode gradually decreases, and so, if a current greater than the laser limit point is injected, the line width decreases to 0.75 nm which is a resolution limit of the spectrometer. In this case, the experimental Q factor of the cavity is estimated to be 2,100 or above, which is the same as the simulation result obtained in FIG. 7b.

In addition, the electric characteristics of the microdisk nanolaser may be measured by observing the change of current flowing at the resonator while changing the voltage applied to the resonator (the small graph in FIG. 9b). A turn-on voltage and an electric resistance are respectively ~1.2 V and ~5.8 kΩ.

Figure 10:
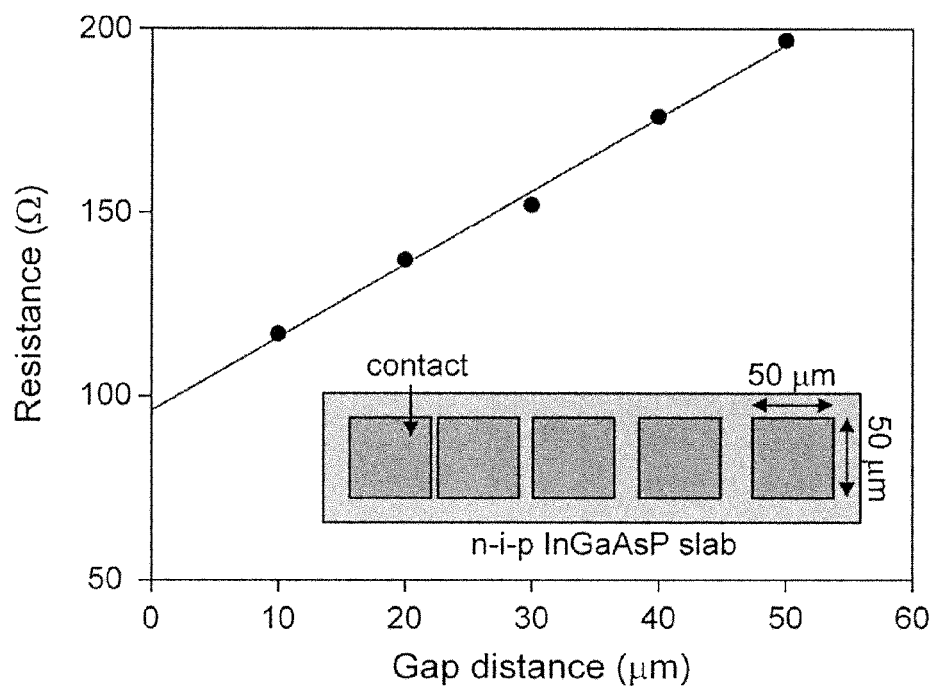
FIG. 10 is a graph, measured by a TLM, showing a contact resistance generated at the nanolaser generator manufactured according to an embodiment of the present disclosure.

FIG. 10 is a graph, measured by a TLM, showing a contact resistance generated at the nanolaser generator of the present disclosure.

The contact resistance is estimated to be 4.9 kΩ or below as a result of transmission line method (TLM) measurement. The total resistance of the nanolaser generator was 5.8 kΩ which is relatively high, most of which are generated by a contact resistance between the InGaAsP material of the microdisk resonator and the graphene electrode.

The contact resistance may be reduced greatly by introducing a metal layer between the graphene electrode and the microdisk resonator. In detail, if a gold layer using gold as a metal is provided at the center portion of the microdisk resonator, a low total resistance of 2.3 kΩ or below is measured.

In addition, the contact resistance may be reduced by increasing doping of the microdisk resonator or the graphene electrode.

On the other hand, the contact of the graphene electrode gives uniform current injection and efficient current diffusion to the n-InGaAsP epilayer of the microdisk resonator due to a low sheet resistance of the graphene electrode.

Figure 11:
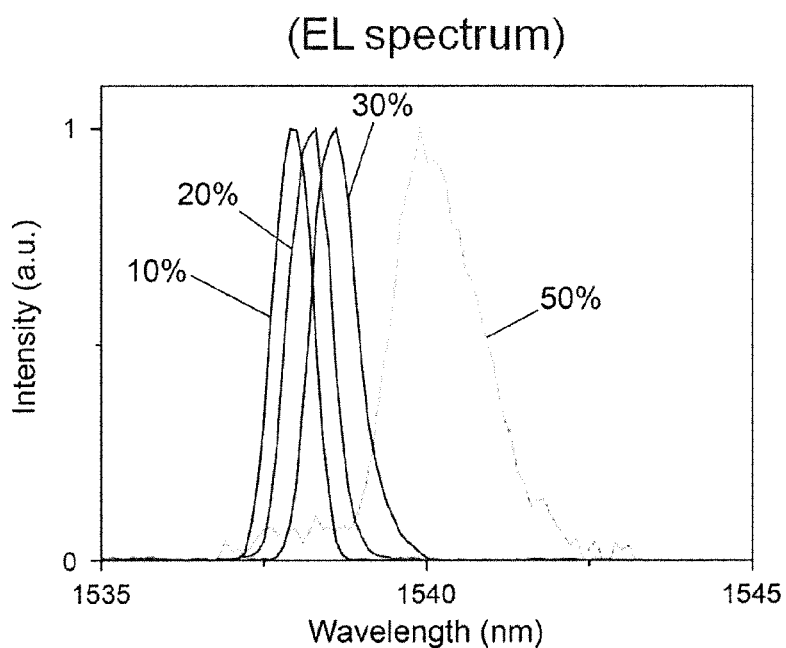
FIG. 11 is a graph showing a measured spectrum change of light generated according to a ratio (duty cycle) of a current pulse injected into the nanolaser generator manufactured according to an embodiment of the present disclosure.

FIG. 11 is a graph showing a measured spectrum of a nanolaser emitted while changing a ratio (duty cycle) of a current pulse injected into the nanolaser generator of the present disclosure.

In order to examine the possibility of a continuous-wave (CW) nanolaser work, a pulse width of the injected current was changed in the range of 100 to 500 ns for 1 μs. The nanolaser work is accomplished by injecting a current pulse of ≤30% duty cycle (usage rate), and substantially the same limit current and nanolaser wavelength are observed for every pulse width.

However, when the current pulse is injected at a ratio of 50%, the generation mode shows serious red deviation, which is determined as being not a laser mode, since, for example, a line width is increased. This observation shows that the injection of a pulse with a great width, which is >50% duty cycle, may cause a serious thermal problem between the graphene electrode and the microdisk resonator.

In comparison to a general microdisk cavity having a pole structure of a similar size which enables the CW nanolaser work, a relatively high contact resistance (between the graphene electrode and the microdisk resonator) may be an important source of thermal problems in the nanolaser generator.

Meanwhile, in the nanolaser generator having the gold layer at the center portion of the microdisk resonator, due to the reduced contact resistance, the nanolaser work was successfully accomplished by injecting a current pulse having a great width which is 50% duty cycle.

It is estimated that the improvement of the nanolaser generator directed to reducing a contact resistance may explain the CW nanolaser work.

Single Nanopillar LED using the Graphene Electrode

The single nanopillar LED using a graphene electrode includes a nanopillar, an external dielectric ring provided at an outer side of the nanopillar, and a transparent graphene electrode provided at upper surfaces of the nanopillar and the external dielectric ring.

The single nanopillar LED does not have a protruding dielectric ring and an InP pole, different from the nanolaser generator. Other configurations of the single nanopillar LED are substantially identical to those described above in regard to the nanolaser generator.

Figure 12:
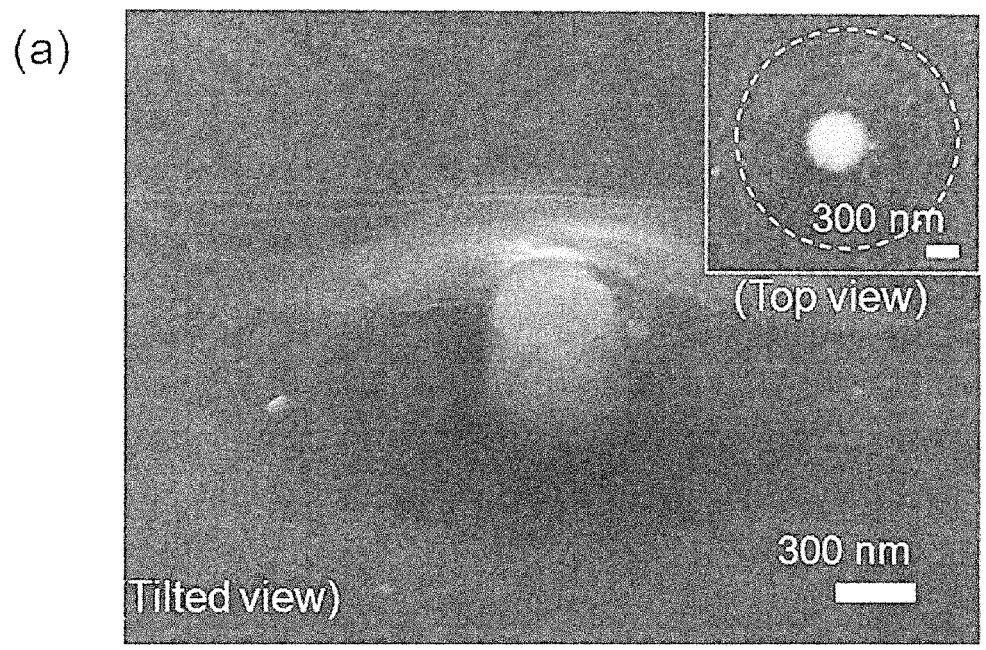
FIG. 12a is a photograph, taken by an SEM, showing a single nanopillar LED using a graphene electrode manufactured according to another embodiment of the present disclosure.
FIG. 12b is a graph showing electroluminescence of the single nanopillar LED using a graphene electrode manufactured according to another embodiment of the present disclosure.
Figure 12:
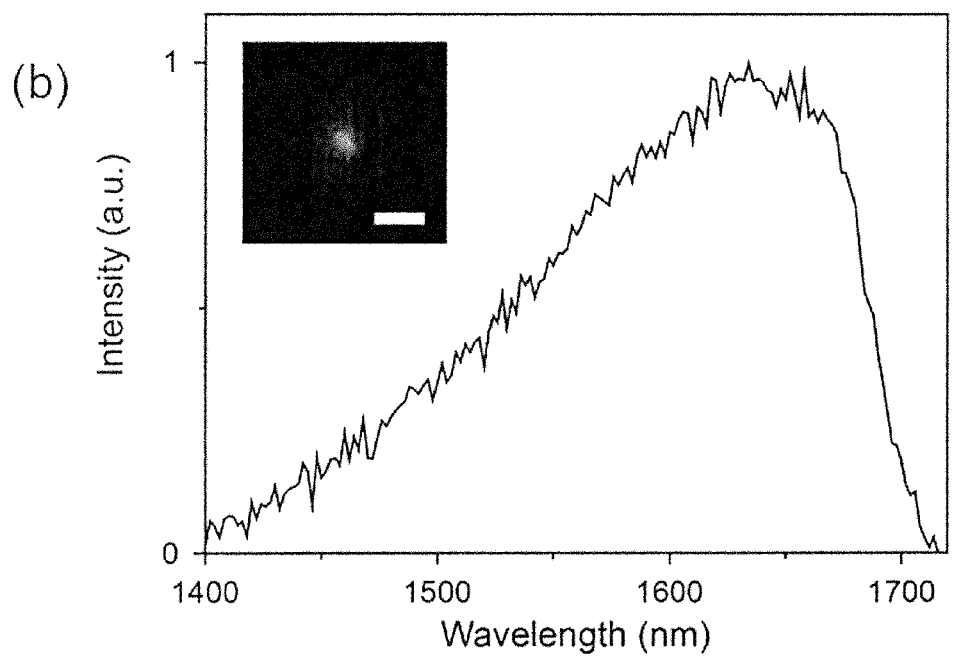

FIG. 12a is a photograph, taken by an SEM, showing a single nanopillar LED using a graphene electrode, and FIG. 12b is a graph showing electroluminescence of the single nanopillar LED using a graphene electrode.

In order to utilize the transparent graphene electrode to the maximum, electric pumping is performed to the single nanopillar LED of a sub-micrometer size.

As shown in FIG. 12a, the multi-layered graphene electrode has a nanopillar structure having a diameter of 500 nm or less without a protruding dielectric ring and an InP pole, and a white dotted line represents a boundary of the external dielectric ring.

As shown in FIG. 12b, a bright point (the photograph of FIG. 12b) observed in the mode image shows important light emission from the nanopillar. In addition, an EL spectrum having a maximum wavelength of 1,600 nm or less is clearly measured. This measurement reveals that an electric-driven nanopillar LED may be implemented by injecting a current to a nanopillar having a much smaller size than a wavelength by using the graphene electrode.

It is astonishing that the single nanopillar LED proposes efficient electric pumping with various nano-photon devices such as a plasmonic laser, a nanowire laser and a micro/nanopillar device.

Measurement of EL (electroluminescence)

In the graphene-contacting microdisk resonator or the nanopillar cavity, the EL is measured at a room temperature by contacting a tungsten tip to the graphene electrode having a diameter of 1 μm deposited on the external dielectric ring.

The sample was attached to an aluminum plate by using a conductive silver paste. A forward bias was applied to the tungsten tip at the aluminum plate.

In addition, a pulse generator (Agilent 33521A) was used, and the EL was measured at 1 μs intervals while changing a pulse ratio (duty cycle) therein.

The light emitted from each microdisk resonator or nanopillar was collected by a x20long-working-distance object lens (including an aperture value of 0.4) which focuses on either an InGaAs IR charge-coupled device (CCD) camera or an analyzer having a resolution limit of 0.75 nm or less.

In FIG. 9a, the mode image was photographed by an IR camera using an aperture value of 0.42 and a x50 long-working-distance object lens.

Method for calculating FDTD In the 3D FDTD simulation, a refractive index of graphite was used as a refractive index of the multi-layered graphene. The graphite used herein was modeled using a Drude critical point (D-CP) model which may model dispersion characteristics of a material over a broad wavelength range:

$$\varepsilon(\omega) = \varepsilon_\infty - \frac{\omega_D^2}{\omega^2 + i\gamma_D\omega} + \sum_{p=1}^{P} G_P(\omega) \quad (1)$$

$$G_P(\omega) = A_P\omega_P\left(\frac{e^{i\phi_P}}{\omega_P - \omega - i\gamma_P} + \frac{e^{-i\phi_P}}{\omega_P + \omega + i\gamma_P}\right) \quad (2)$$

In the equations, $\varepsilon_\infty$ represents a background dielectric value in an infinite wavelength, ω represents an angular frequency, ωD and ωp represent electron plasma frequencies, yD and yp represent effective collision frequencies, φp represents a phase, Ap represents a weighting factor and p represents the number of important poles.

The D-CP model uses dielectric characteristic constants of the graphite, experimentally determined in the near-IR and visible ray regions (0.21.4 eV).

The followings are parameters used in the simulation: $\varepsilon_\infty$=4.53, ωD =8.31 eV, yD=10.86 eV, ωp1=1.07, yp1=0.17 eV, Ap1=0.53, φp1 =0.078 rad, 107 p2 =0.30 eV, yp2 =0.35 eV, Ap2=10.28, φp2 =0.99 rad, and two important poles were assumed.

By using the D-CP model using characteristic constants of graphite, refractive indexes experimentally measured over a broad wavelength range may be modeled.

In order to show the graphene electrode of a nanometer scale, a vertical mesh having a size of 0.5 nm was used. In addition, since the microdisk resonator has a relatively great horizontal size, a horizontal mesh size of 10 nm was introduced to reduce the use of a calculating memory.

The refractive indexes of the InGaAsP microdisk resonator and the dielectric ring (PMMA layer) were respectively set to be 3.4 and 1.5 in the 3D FDTD simulation. The uniaxial perfectly matched layer (PML) was used to apply a suitable absorption condition at the boundary.

The above embodiments are proposed for better understanding of the present disclosure, not intended to limit the scope of the present disclosure, and it should be understood that various modifications available therefrom may also be included in the scope of the present disclosure. For example, each component depicted in the embodiments of the present disclosure may be implemented separately, or several separate components may be coupled and implemented. Therefore, the scope of the present disclosure should be defined by the appended claims, and it should be understood that the scope of the present disclosure is not limited to literal meanings of the claims but may substantially extend to equivalents thereof.

What is claimed is:

1. A nanolaser generator, comprising:
   a microdisk resonator;
   a protruding dielectric ring provided to surround a boundary surface of the microdisk resonator;
   an external dielectric ring provided at an outer side of the microdisk resonator; and
   a transparent graphene electrode provided at upper surfaces of the microdisk resonator, the protruding dielectric ring and the external dielectric ring.

2. The nanolaser generator according to claim 1, wherein a metal layer is further provided at a center portion of the microdisk resonator.

3. The nanolaser generator according to claim 2, wherein the metal layer is at least one selected from the group consisting of gold, a gold/germanium alloy, a gold/zinc alloy and a nickel/gold/germanium alloy.

4. The nanolaser generator according to claim 1, wherein the transparent graphene electrode has five to ten layers.

5. The nanolaser generator according to claim 1, wherein the transparent graphene electrode has transmittance of 91.9% or above when electroluminescence is 1,550 nm.

6. The nanolaser generator according to claim 1, wherein the dielectric ring is made of polymethylmethacrylate.

7. The nanolaser generator according to claim 1, wherein the microdisk resonator includes an InGaAsP quantum well of an n-i-p layer.

8. The nanolaser generator according to claim 1, wherein the nanolaser generator generates a nanolaser when a micro current of 300 μA or below is applied to the transparent graphene electrode.

9. A method for manufacturing a nanolaser generator comprising:
   forming a protruding dielectric ring at a boundary surface of an InGaAsP microdisk resonator made with a wafer composed of an InGaAsP layer, an InP sacrificial layer and an InP matrix layer by processing a dielectric material into a ring structure to surround the microdisk resonator;
   removing the InP sacrificial layer below the InGaAsP microdisk resonator while remaining an InP pole by means of wet etching;
   forming an external dielectric ring by processing a dielectric material into a ring structure again at an outer side of the InGaAsP microdisk resonator; and
   providing a transparent graphene electrode at upper surfaces of the InGaAsP microdisk resonator, the protruding dielectric ring and the external dielectric ring.

10. The method for manufacturing a nanolaser generator according to claim 9, between said forming of the protruding dielectric ring at the InGaAsP microdisk resonator and said removing of the InP sacrificial layer, further comprising:
    providing a metal layer to a center portion of the InGaAsP microdisk resonator.

11. The method for manufacturing a nanolaser generator according to claim 9, wherein the transparent graphene electrode has five to ten layers.

12. The method for manufacturing a nanolaser generator according to claim 9, wherein the transparent graphene electrode has transmittance of 91.9% or above when electroluminescence is 1,550 nm.

13. The method for manufacturing a nanolaser generator according to claim 9, wherein the dielectric material is polymethylmethacrylate.

14. A single nanopillar LED, comprising:
a nanopillar;
an external dielectric ring provided at an outer side of the nanopillar; and
a transparent graphene electrode provided at upper surfaces of the nanopillar and the external dielectric ring,
wherein the transparent graphene electrode has transmittance of 91.9% or above when electroluminescence is 1,550 nm.

15. The single nanopillar LED according to claim 14, wherein the dielectric ring is made of polymethylmethacrylate.

\* \* \* \* \*